United States Patent
Arita et al.

(10) Patent No.: US 11,942,310 B2
(45) Date of Patent: Mar. 26, 2024

(54) ACTIVE GAS GENERATION APPARATUS

(71) Applicant: Toshiba Mitsubishi-Electric Industrial Systems Corporation, Tokyo (JP)

(72) Inventors: Ren Arita, Tokyo (JP); Kensuke Watanabe, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 482 days.

(21) Appl. No.: 17/312,007

(22) PCT Filed: Nov. 12, 2019

(86) PCT No.: PCT/JP2019/044356
§ 371 (c)(1),
(2) Date: Jun. 9, 2021

(87) PCT Pub. No.: WO2021/095120
PCT Pub. Date: May 20, 2021

(65) Prior Publication Data
US 2022/0059322 A1    Feb. 24, 2022

(51) Int. Cl.
*H01J 37/32* (2006.01)
*H05H 1/24* (2006.01)

(52) U.S. Cl.
CPC .. *H01J 37/32348* (2013.01); *H01J 37/32541* (2013.01); *H01J 37/32568* (2013.01); *H05H 1/2418* (2021.05)

(58) Field of Classification Search
None
See application file for complete search history.

(56) References Cited

U.S. PATENT DOCUMENTS

| | | | |
|---|---|---|---|
| 8,361,276 | B2 | 1/2013 | Selwyn |
| 9,006,972 | B2 | 4/2015 | Hopwood |
| 9,288,886 | B2 | 3/2016 | Koo |
| 10,450,654 | B2 | 10/2019 | Watanabe et al. |
| 10,793,953 | B2 | 10/2020 | Watanabe |
| 10,840,065 | B2 | 11/2020 | Watanabe |

(Continued)

FOREIGN PATENT DOCUMENTS

| | | |
|---|---|---|
| CN | 106797698 A | 5/2017 |
| JP | 2004-211161 A | 7/2004 |

(Continued)

OTHER PUBLICATIONS

Office Action dated Jun. 22, 2022, in corresponding Chinese patent Application No. 201880093516.1, 19 pages.

(Continued)

*Primary Examiner* — Dedei K Hammond
(74) *Attorney, Agent, or Firm* — XSENSUS LLP

(57) ABSTRACT

In an active gas generation apparatus of the present invention, an auxiliary conductive film provided on a first electrode dielectric film is provided to overlap part of an active gas flow path in plan view, and the auxiliary conductive film is set to the ground potential. An active gas auxiliary member provided on a second electrode dielectric film is provided to fill part of the active gas flow path between a discharge space and a gas ejection hole in a dielectric space between the first and second electrode dielectric films in order to limit to an active gas flow gap.

3 Claims, 8 Drawing Sheets

(56) References Cited

U.S. PATENT DOCUMENTS

| | | |
|---|---|---|
| 10,879,085 B2 | 12/2020 | Tabata |
| 10,889,896 B2 | 1/2021 | Nishimura |
| 10,927,454 B2 | 2/2021 | Nishimura |
| 10,971,338 B2 | 4/2021 | Arita |
| 11,129,267 B2 | 9/2021 | Watanabe |
| 11,239,059 B2 | 2/2022 | Watanabe |
| 11,466,366 B2 | 10/2022 | Tabata et al. |
| 2004/0094411 A1 | 5/2004 | Chistyakov |
| 2013/0240144 A1 | 9/2013 | Buchberger et al. |
| 2013/0260567 A1 | 10/2013 | Marakhtanov |
| 2016/0163515 A1* | 6/2016 | Maruyama ........ H01L 21/67069 438/758 |
| 2017/0241021 A1 | 8/2017 | Tabata |
| 2018/0200687 A1 | 7/2018 | Tabata et al. |
| 2018/0223433 A1 | 8/2018 | Watanabe et al. |
| 2020/0152424 A1 | 5/2020 | Arita et al. |
| 2020/0176223 A1 | 6/2020 | Watanabe et al. |
| 2020/0260565 A1 | 8/2020 | Watanabe |
| 2020/0291515 A1 | 9/2020 | Nishimura et al. |
| 2020/0343078 A1 | 10/2020 | Watanabe |
| 2021/0057192 A1 | 2/2021 | Arita |
| 2021/0233748 A1 | 7/2021 | Watanabe et al. |
| 2022/0007487 A1 | 1/2022 | Watanabe et al. |
| 2022/0046781 A1 | 2/2022 | Watanabe et al. |
| 2022/0059322 A1 | 2/2022 | Arita |
| 2022/0174807 A1 | 6/2022 | Arita et al. |
| 2023/0013017 A1 | 1/2023 | Arita et al. |
| 2023/0025809 A1 | 1/2023 | Arita et al. |
| 2023/0034041 A1 | 2/2023 | Watanabe et al. |

FOREIGN PATENT DOCUMENTS

| | | | |
|---|---|---|---|
| JP | 2006-506521 A | 2/2006 | |
| JP | 2006-303075 A | 11/2006 | |
| JP | 2007-141583 A | 6/2007 | |
| JP | 2009-205896 A | 9/2009 | |
| JP | 2009205896 * | 9/2009 | ........... H01L 21/304 |
| JP | 2013-225672 A | 10/2013 | |
| JP | 6239483 B2 | 11/2017 | |
| KR | 10-2016-0063297 A | 6/2016 | |
| WO | 2015/019765 A1 | 2/2015 | |
| WO | 2017/159838 A1 | 9/2017 | |
| WO | 2019/229873 A1 | 12/2019 | |

OTHER PUBLICATIONS

International Search Report and Written Opinion dated Jan. 28, 2020, received for PCT Application PCT/JP2019/044356, Filed on Nov. 12, 2019, 8 pages including English Translation.

International Search Report and Written Opinion dated Feb. 10, 2020, received for PCT Application No. PCT/JP2019/046328, Filed on Nov. 27, 2019, 8 pages including English Translation.

Office Action dated May 10, 2023, in corresponding U.S. Appl. No. 17/416,531, 8 pages.

International Search Report and Written Opinion dated Aug. 21, 2018 for PCT/JP2018/020736 filed on May 30, 2018, 9 pages including English Translation of the International Search Report.

Chinese Office Action dated Nov. 7, 2022, in corresponding Chinese Patent Application 201880093516.1, 14pp.

* cited by examiner

TO PROCESSING SPACE 63

F I G. 6
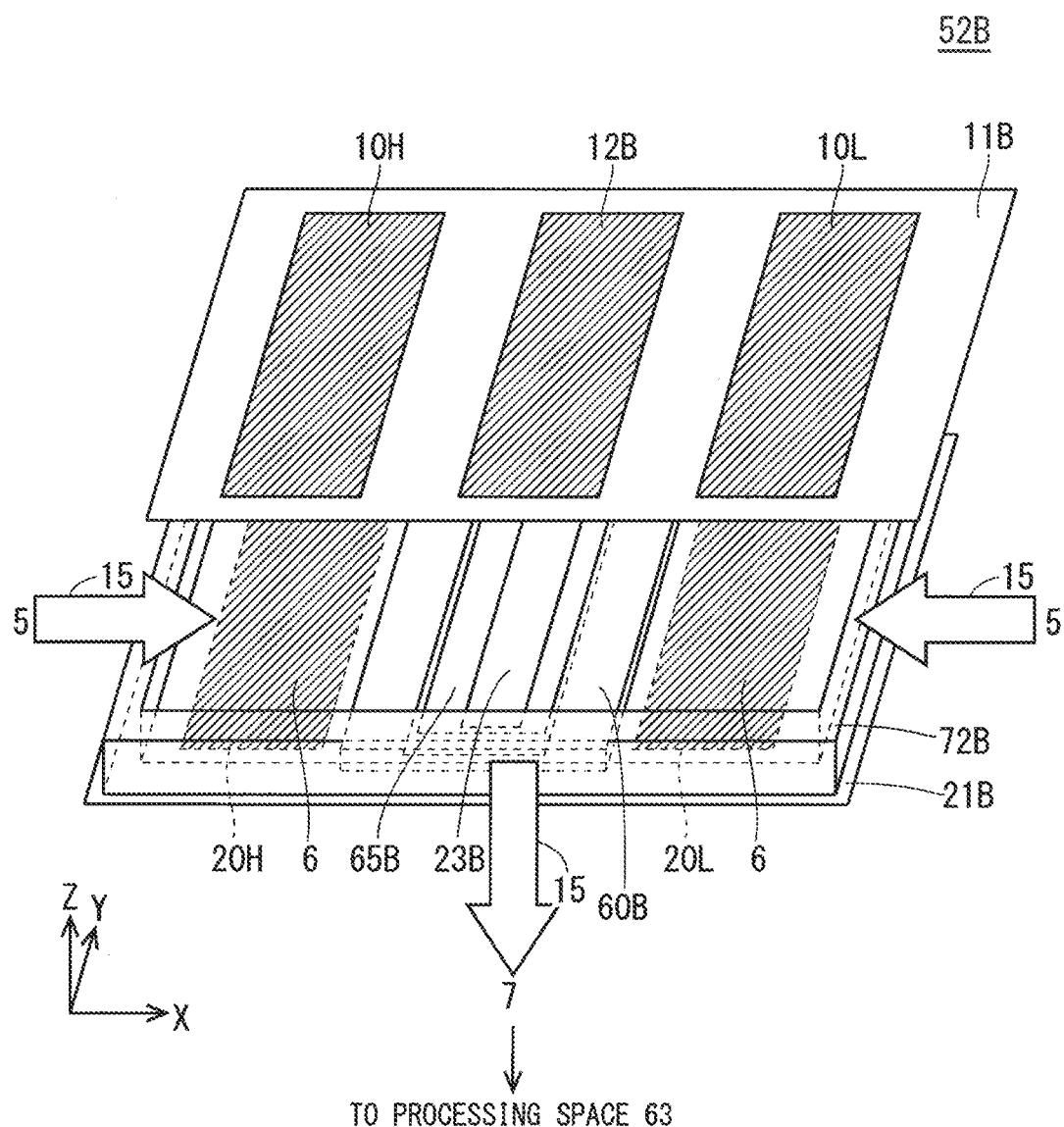
TO PROCESSING SPACE 63

TO PROCESSING SPACE 63

ACTIVE GAS GENERATION APPARATUS

CROSS-REFERENCE TO RELATED APPLICATION

The present application is based on PCT filing PCT/JP2019/044356, filed Nov. 12, 2019, the entire contents of which are incorporated herein by reference.

TECHNICAL FIELD

The present invention relates to an active gas generation apparatus that generates an active gas by a parallel plate type dielectric barrier discharge and supplies the active gas to a subsequent processing space.

BACKGROUND ART

An active gas generation apparatus that generates an active gas by a parallel plate type dielectric barrier discharge is disclosed, for example, in Patent Document 1.

FIG. 8 is an explanatory view illustrating a schematic configuration of a conventional nitrogen radical generation system 300 disclosed in Patent Document 1. The nitrogen radical generation system 300 includes a nitrogen radical generation apparatus 301, an AC voltage source 308, and a processing chamber 312.

The nitrogen radical generation apparatus 301, which is an active gas generation apparatus, generates a nitrogen radical, which is an active gas, from a nitrogen gas by using a dielectric barrier discharge.

In a space 302 in the nitrogen radical generation apparatus 301, a discharge unit for generating the dielectric barrier discharge is provided. Here, the above discharge unit includes a first electrode 303 and a second electrode 304.

The second electrode 304 is installed at the center of the bottom surface of the nitrogen radical generation apparatus 301. The first electrode 303 is provided to face the second electrode 304. Here, the first electrode 303 and the second electrode 304 face each other at a predetermined interval. That is, a discharge space 305 is formed between the first electrode 303 and the second electrode 304.

Also, on at least one of the main surface (discharge space forming surface) of the first electrode 303 facing the discharge space 305 and the main surface (discharge space forming surface) of the second electrode 304 facing the discharge space 305, a dielectric (not illustrated in FIG. 8) is provided.

The discharge unit can generate a dielectric barrier discharge in the discharge space 305 between the first electrode 303 and the second electrode 304.

At the center of the upper surface of the nitrogen radical generation apparatus 301, a gas supply port 306 is provided. Through the gas supply port 306, a nitrogen gas, which is a raw material gas, is supplied from the outside of the nitrogen radical generation apparatus 301 to the space 302 in the nitrogen radical generation apparatus 301.

At the center of the second electrode 304, one gas discharge unit 307, which is a through hole for discharging a nitrogen radical gas to the outside of the nitrogen radical generation apparatus 301, is drilled.

The AC voltage source 308 applies a high AC voltage to the discharge unit. One terminal of the AC voltage source 308 is electrically connected to the first electrode 303. The other terminal of the AC voltage source 308 is electrically connected to the housing (ground) of the nitrogen radical generation apparatus 301. As can be seen from the above, the second electrode 304 is provided on the bottom surface of the nitrogen radical generation apparatus 301. Therefore, the other terminal of the AC voltage source 308 is electrically connected to the second electrode 304 via the nitrogen radical generation apparatus 301.

That is, the AC voltage source 308 applies a high AC voltage between the first electrode 303 and the second electrode 304. By applying the AC voltage, a dielectric barrier discharge is generated in the discharge space 305 between the first electrode 303 and the second electrode 304.

The nitrogen gas supplied from the gas supply port 306 enters the discharge space 305 from the outer periphery of each of the electrodes 303, 304. Then, the nitrogen gas propagates from the outer periphery of each of the electrodes 303, 304 to the inside. A nitrogen radical gas is generated from the propagating nitrogen gas by the dielectric barrier discharge being generated in the discharge space 305. The generated nitrogen radical gas is output from the gas discharge unit 307 to the outside of the nitrogen radical generation apparatus 301.

As illustrated in FIG. 8, the processing chamber 312 is provided below the nitrogen radical generation apparatus 301. Here, the bottom surface of the nitrogen radical generation apparatus 301 and the upper surface of the processing chamber 312 contact each other.

Also, an orifice part 309 is provided between the nitrogen radical generation apparatus 301 and the processing chamber 312. The orifice part 309 connects the gas discharge unit 307 and a processing room 311 in the processing chamber 312 via a narrow hole 310.

The diameter of the narrow hole 310 of the orifice part 309 is smaller than the diameter of the hole of the gas discharge unit 307. More specifically, the diameter of the entrance of the narrow hole 310 of the orifice part 309 is smaller than the diameter of the exit of the hole of the gas discharge unit 307. Therefore, pressure division between the space 302 in the nitrogen radical generation apparatus 301 and the processing room 311 is formed by the narrow hole 310 of the orifice part 309.

In the processing room 311 in the processing chamber 312, a process using nitrogen radicals generated by the nitrogen radical generation apparatus 301 and output from the nitrogen radical generation apparatus 301 (specifically, the gas discharge unit 307) is performed.

As illustrated in FIG. 8, a susceptor 314 is provided in the processing room 311 in the processing chamber 312, and a wafer (substrate) 313 that is a processing object is placed on the susceptor 314. The space in the processing room 311 serves as a processing space that is arranged after the nitrogen radical generation apparatus 301 in order to house a processing object such as the wafer 313.

A gas exhaust part 315 is provided on the side surface of the processing chamber 312. By the gas exhaust part 315, the pressure in the processing room 311 is kept constant within the range of, for example, about 1 Torr to 300 Torr. Additionally, with the gas exhaust processing by the gas exhaust part 315, not only the pressures in the space 302 and the processing room 311 are set, but also the flows of the nitrogen gas and the nitrogen radical gas from the nitrogen radical generation apparatus 301 to the processing chamber 312 are generated.

As described above, the nitrogen radical generation apparatus 301 in the conventional nitrogen radical generation system 300 illustrated in FIG. 8: generates a dielectric barrier discharge in the discharge space 305 between the first electrode 303 and the second electrode 304; and supplies the active gas obtained by the dielectric barrier discharge to the processing room 311, which is a subsequent device, via the gas discharge unit 307 and the narrow hole 310 of the orifice part 309.

PRIOR ART DOCUMENT

Patent Document

Patent Document 1: Japanese Patent Publication No. 6239483

SUMMARY

Problem to be Solved by the Invention

The nitrogen radical generation apparatus 301, which is the conventional active gas generation apparatus illustrated in FIG. 8, generates a dielectric barrier discharge in the discharge space 305 between the first electrode 303 and the second electrode 304, and obtains an active gas by activating a raw material gas. This active gas is supplied to the subsequent processing chamber 312 via the gas discharge unit 307 and the narrow hole 310 provided in the orifice part 309.

In a parallel plate type electrode pair that generates a dielectric barrier discharge, it is necessary that the discharge space forming surface of at least one of the electrodes facing each other is an insulator. A conductor has a tendency that the elements of the surface are more likely to ionize than an insulator, and in a semiconductor manufacturing apparatus, an ionized element can cause contamination in a semiconductor. Therefore, it is desirable that the discharge space forming surfaces of the first electrode 303 and the second electrode 304 are both insulators.

If the discharge space forming surfaces of the first electrode 303 and the second electrode 304 are both insulators, however, the electric field applied to generate a dielectric barrier discharge may leak to the subsequent processing chamber 312 through the electrodes, so that dielectric breakdown may occur in the processing room 311.

This is because the processing room 311 in the subsequent processing chamber 312 is under a higher vacuum atmosphere than the space in which the first electrode 303 and the second electrode 304 exist.

Additionally, the processing space in the processing room 311 is generally set to a relatively low pressure, and hence the electric field strength that causes the dielectric breakdown tends to become small as the pressure in the processing space decreases. Therefore, it is important to release the electric field strength in the processing space.

As a method for releasing the electric field strength, there is a method in which the distance between the discharge space 305, which is a space for generating a discharge, and the orifice part 309 or the gas discharge unit 307, which is a connection portion with the subsequent processing room 311, is efficiently increased.

If this method is adopted, however, the distance between the discharge space 305 that generates an active gas and the subsequent processing room 311 is inevitably increased, and hence the time during which the active gas reaches the subsequent processing room 311 increases, so that there is the problem that the active gas may deactivate (disappear).

As another method, there is also a method in which the AC voltage to be applied by the AC voltage source 308 is lowered, however, there is the problem in this method that the absolute amount of the generated active gas is decreased, so that the method cannot be practically adopted.

A purpose of the present invention is to provide an active gas generation apparatus that can: solve the above problems; intentionally weaken the electric field strength in the processing space provided after (below) the apparatus; and minimize the deactivation amount of an active gas.

Means to Solve the Problem

An active gas generation apparatus according to the present invention is one that generates an active gas obtained by activating a raw material gas supplied to a discharge space, and includes a first electrode component and a second electrode component provided below the first electrode component, in which: the first electrode component has a first electrode dielectric film and a first metal electrode formed on the upper surface of the first electrode dielectric film; the second electrode component has a second electrode dielectric film and a second metal electrode formed on the lower surface of the second electrode dielectric film; an AC voltage is applied between the first and second metal electrodes; a dielectric space in which the first and second electrode dielectric films face each other includes, as the discharge space, an area where the first and second metal electrodes overlap each other in plan view; the second electrode dielectric film has a gas ejection hole for ejecting the active gas outside; a path from the discharge space to the gas ejection hole is defined as an active gas flow path; the first electrode component further has an auxiliary conductive film formed, independently of the first metal electrode, on the upper surface of the first electrode dielectric film; and the auxiliary conductive film is provided to overlap part of the active gas flow path in plan view, and the auxiliary conductive film Is set to a ground potential, and the active gas generation apparatus further includes an active gas auxiliary member provided to fill part of the active gas flow path between the discharge space and the gas ejection hole in the dielectric space.

Effects of the Invention

The active gas generation apparatus according to the present invention has a first characteristic in which: the auxiliary conductive film is provided to overlap part of the active gas flow path in plan view; and the auxiliary conductive film is set to the ground potential.

Additionally, the active gas generation apparatus according to the present invention has a second characteristic in which: the active gas generation apparatus further includes an active gas auxiliary member provided to fill part of the active gas flow path between the discharge space and the gas ejection hole in the dielectric space.

Since the active gas generation apparatus according to the present invention has the first characteristic, the electric field strength in the active gas flow path can be released by the auxiliary conductive film set to the ground potential.

Since the active gas generation apparatus according to the present invention has the second characteristic, the space volume of the active gas flow path can be reduced by such an extent that part of the active gas flow path is filled with the active gas auxiliary member, whereby the time during which the active gas passes through the active gas flow path can be shortened to such an extent that the active gas does not deactivate.

As a result, the active gas generation apparatus according to the present invention has effects in which: the electric field strength in the active gas flow path can be released; and the deactivation amount of the active gas can be minimized.

The purposes, characteristics, aspects, and advantages of the present invention will become more apparent from the following detailed description and the accompanying drawings.

BRIEF DESCRIPTION OF DRAWINGS

FIG. 6 is an explanatory view schematically illustrating the entire configuration of an active gas generation electrode group of a second aspect of the second embodiment.

DESCRIPTION OF EMBODIMENTS

<Base Technology>
(Basic Configuration)

Figure 7:
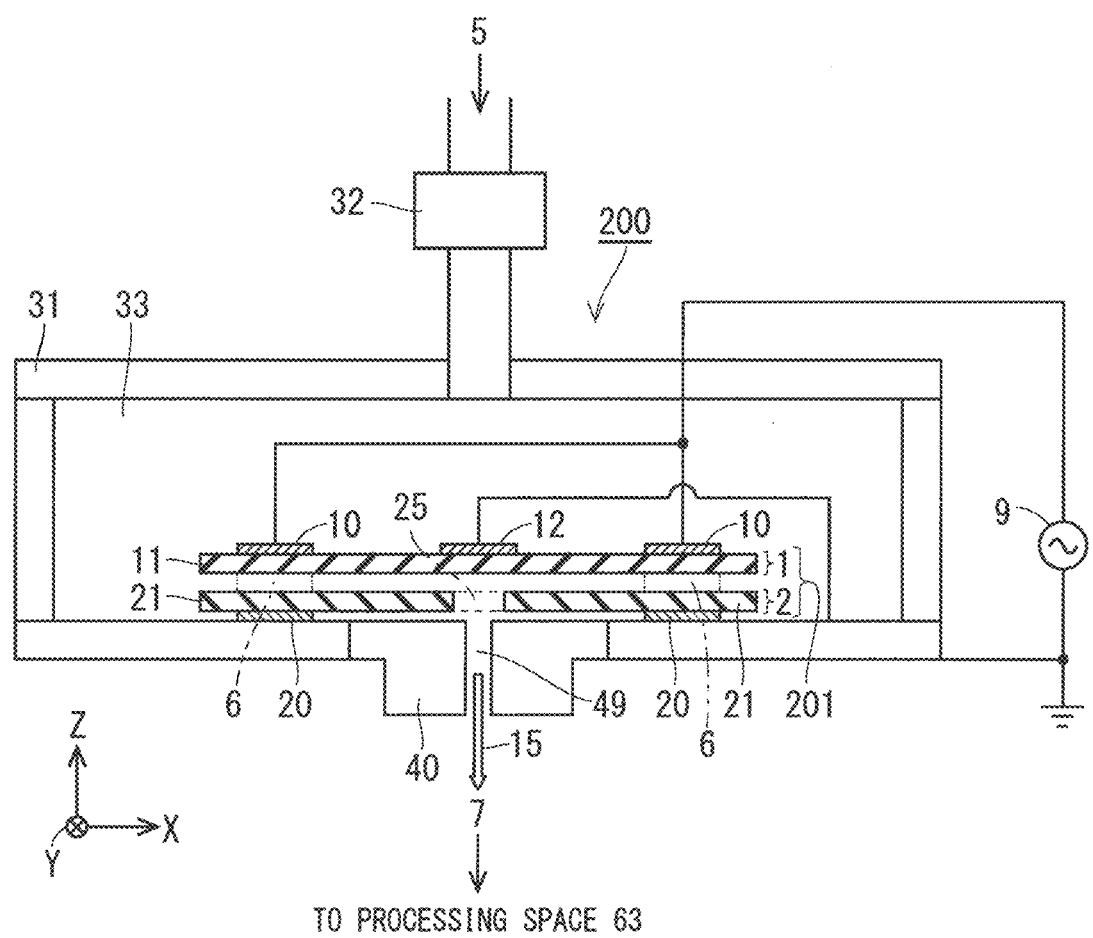
FIG. 7 is an explanatory view illustrating the basic configuration of an active gas generation apparatus that is a base technology.
Figure 8:
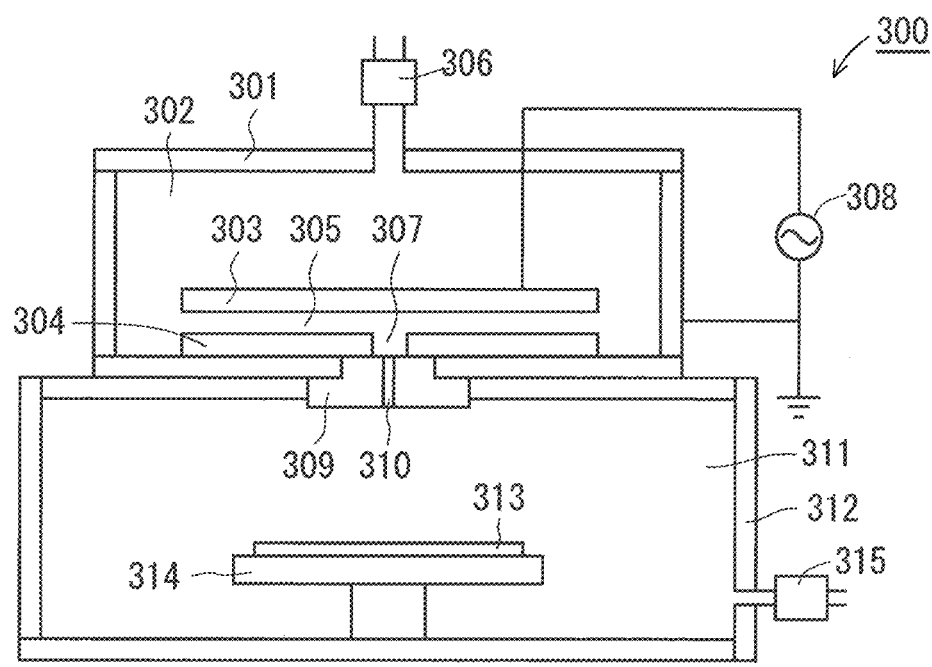
FIG. 8 is an explanatory view illustrating a schematic configuration of a conventional nitrogen radical generation system.

FIG. 7 is an explanatory view illustrating the basic configuration of an active gas generation apparatus that is a base technology of the present invention. FIG. 7 illustrates an XYZ orthogonal coordinate system. A gas generation apparatus 200 of the base technology is an active gas generation apparatus that generates an active gas 7 (nitrogen radical or the like) obtained by activating a raw material gas 5 (nitrogen gas or the like) supplied to a discharge space 6.

The gas generation apparatus 200 includes, as the main components, a metal housing 31, a gas supply port 32, an active gas generation electrode group 201, and an orifice part 40.

The metal housing 31 is a housing for the metal gas generation apparatus 200 set to the ground potential, and the gas supply port 32 is attached to an upper portion, so that the raw material gas 5 is supplied from the gas supply port 32 to an in-housing space 33 in the metal housing 31.

The active gas generation electrode group 201 is arranged in the in-housing space 33 in the metal housing 31 of the gas generation apparatus 200. Specifically, the active gas generation electrode group 201 is arranged on the bottom surface of the metal housing 31. The orifice part 40 is incorporated in part of the bottom surface of the metal housing 31.

The active gas generation electrode group 201 includes a combination of a high-voltage application electrode unit 1 that is a first electrode component and a ground potential electrode unit 2 that is a second electrode component, the ground potential electrode unit 2 being provided below the high-voltage application electrode unit 1.

The high-voltage application electrode unit 1 includes, as the main components, an electrode dielectric film 11 that is a first electrode dielectric film and an electrode conductive film 10 that is a first metal electrode formed on the upper surface of the electrode dielectric film 11. The high-voltage application electrode unit 1 is formed, independently of the electrode conductive film 10, on the upper surface of the electrode dielectric film 11, and further has a metal auxiliary conductive film 12 having conductivity.

The auxiliary conductive film 12 is provided between at least one gas ejection hole 25 and the metal electrode conductive film 10 in plan view. The metal auxiliary conductive film 12 may overlap at least the one gas ejection hole 25 in plan view.

The electrode conductive film 10 and the auxiliary conductive film 12 are provided on the upper surface of the electrode dielectric film 11 by using, for example, a sputtering method or a printing-firing method.

The ground potential electrode unit 2 includes, as the main components, an electrode dielectric film 21 that is a second electrode dielectric film and an electrode conductive film 20 that is a second metal electrode formed on the lower surface of the electrode dielectric film 21.

The electrode conductive film 20 that is made of metal and has conductivity is provided on the lower surface of the electrode dielectric film 21 by using a sputtering method, a printing-firing method, or the like.

The electrode dielectric film 11 of the high-voltage application electrode unit 1 and the electrode dielectric film 21 of the ground potential electrode unit 2 are installed such that a predetermined constant interval is provided therebetween by a non-illustrated spacer or the like.

Then, an AC voltage is applied between the electrode conductive film 10 and the electrode conductive film 20 from a high-frequency power supply 9. Specifically, an AC voltage is applied to the electrode conductive film 10 from the high-frequency power supply 9, and the electrode conductive film 20 and the auxiliary conductive film 12 are set to the ground potential via the metal housing 31 to which the ground potential is applied.

In the dielectric space in which the electrode dielectric film 11 and the electrode dielectric film 21 face each other, the discharge space 6 is provided to include an area where the electrode conductive films 10 and 20 overlap each other in plan view.

The upper surface of the electrode dielectric film 11 and the lower surface of the electrode dielectric film 21 may be flat, or may have a predetermined shape. For example, the upper surface of the electrode dielectric film 11 may have an uneven shape that serves as an obstacle that prevents creeping discharge from occurring between the electrode conductive film 10 and the auxiliary conductive film 12.

The electrode dielectric film 21 has at least one gas ejection hole 25 for finally ejecting the active gas 7 to an external processing space 63.

The orifice part 40 is provided below the electrode dielectric film 21, and has at least one through hole 49 corresponding to the at least one gas ejection hole 25. The orifice part 40 is made of one of ceramic, glass, and sapphire.

In the gas generation apparatus 200 having such a configuration, a dielectric barrier discharge is generated in the discharge space 6 of the active gas generation electrode group 201 by applying an AC voltage between the electrode conductive films 10 and 20 from the high-frequency power supply 9. At the same time, the raw material gas 5 is supplied from the gas supply port 32 into the in-housing space 33 of the metal housing 31, so that the raw material gas 5 is made flow from the outer periphery to the inside of the active gas generation electrode group 201.

Then, the active gas 7 is generated in the gas generation apparatus 200 with the raw material gas 5 in the discharge space 6 activated, and the generated active gas 7 flows through an active gas flow path that is a path leading to the at least one gas ejection hole 25 from the discharge space 6 in the dielectric space.

The active gas 7 flowing through the active gas flow path is finally supplied to the subsequent processing space 63 along a gas flow 15 via the at least one gas ejection hole 25 and the through hole 49 of the orifice part 40.

In the gas generation apparatus 200 of the base technology, the auxiliary conductive film 12 is provided to overlap part of the active gas flow path in plan view, as described above.

(Effects of Base Technology)

As described above, the gas generation apparatus 200 of the base technology has the following characteristic (1) and characteristic (2).

(1) The auxiliary conductive film 12 is provided to overlap part of the active gas flow path in plan view.

(2) The auxiliary conductive film 12 is set to the ground potential.

Since the gas generation apparatus 200 of the present embodiment has the characteristic (1) and characteristic (2), the electric field strength in the active gas flow path can be released by the auxiliary conductive film 12 that is an auxiliary conductive film set to the ground potential.

As a result, the gas generation apparatus 200 of the present embodiment has an effect in which the electric field strength in the processing space 63 provided after (below) the orifice part 40 can be intentionally weakened without changing the structure of the orifice part 40.

(Problem of Base Technology)

The active gas 7 to be generated in the gas generation apparatus 200 of the above-described base technology is generated by a dielectric barrier discharge in the discharge space 6 between the high-voltage application electrode unit 1 and the ground potential electrode unit 2 of a parallel plate type. This active gas 7 is supplied to the subsequent processing space 63 as a gas necessary for semiconductor manufacturing.

However, the active gas 7 has a property in which it is unstable and decays in time, that is, deactivates over time, as described above.

Examples of the active gas 7 generated in the discharge space 6 can include, for example, nitrogen atoms obtained by dissociating a nitrogen molecule gas by electric discharge. The above-described nitrogen atoms disappear due to collision with other gas molecules. That is, the active gas 7 generated in the discharge space 6 deactivates (disappears) over time, and hence it is necessary that after the active gas 7 is generated, the active gas 7 is quickly supplied to a space in which the active gas 7 is used, that is, to the processing space 63.

In the gas generation apparatus 200 of the base technology, however, the active gas flow path always exists in the dielectric space due to the provision of the auxiliary conductive film 12 for exhibiting the above effects.

The active gas flow path can be shortened by shortening the distance between the electrode conductive film 10 and the auxiliary conductive film 12. However, it is necessary to provide the auxiliary conductive film 12 so as to overlap the active gas flow path in plan view, and hence there is a limit to shortening of the active gas flow path.

As described above, the time during which the active gas 7 passes through the active gas flow path cannot be sufficiently shortened in the base technology, and hence a problem in which the active gas 7 deactivates when passing through the active gas flow path cannot be solved.

Purposes of a first embodiment and a second embodiment described below are to provide an active gas generation apparatus that can: solve the above-described problem of the base technology; intentionally weaken the electric field strength in a processing space provided after (below) the apparatus; and minimize the deactivation amount of an active gas.

First Embodiment (Basic Configuration)

Figure 1:
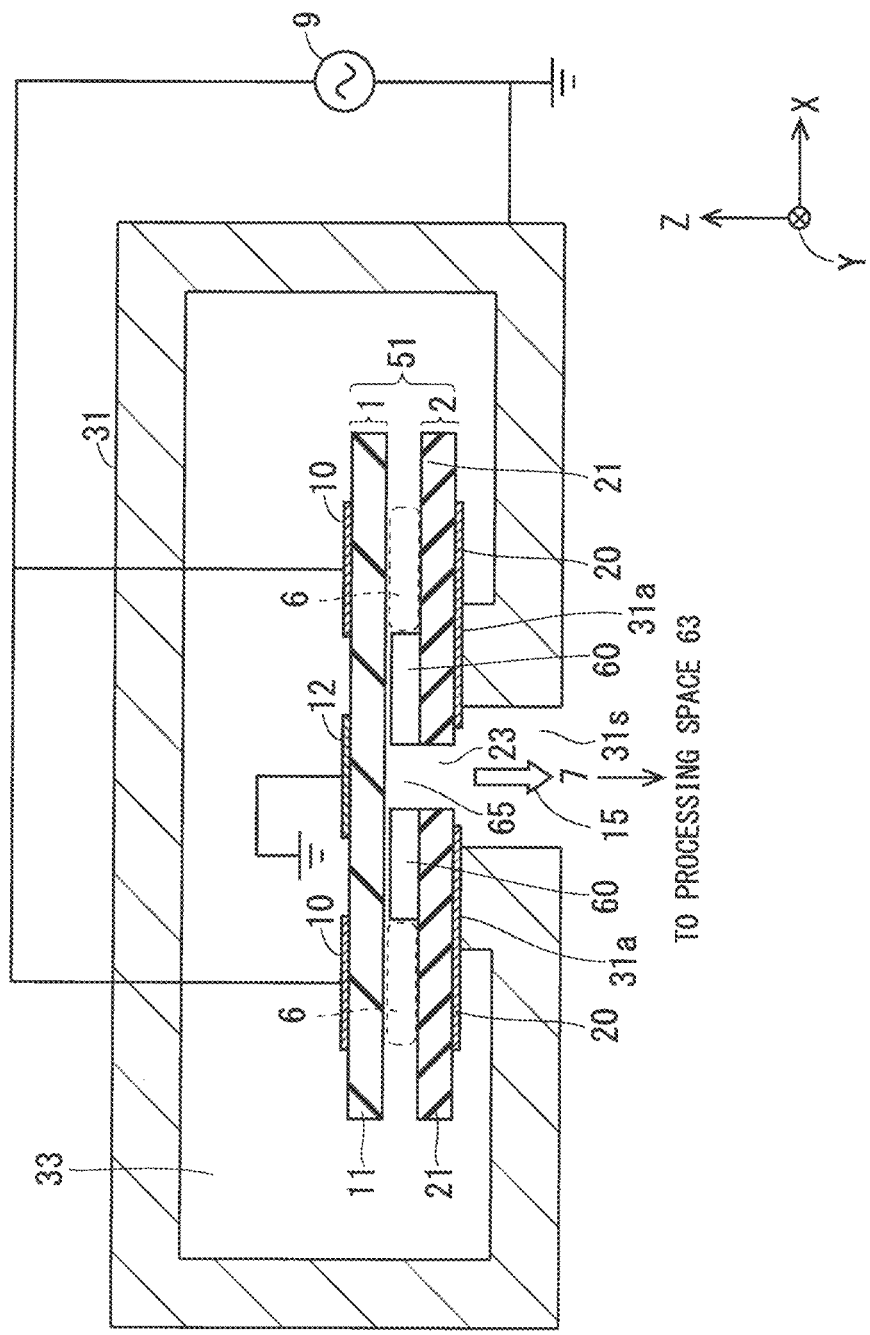
FIG. 1 is an explanatory view illustrating the basic configuration of an active gas generation apparatus according to a first embodiment of the present invention.

FIG. 1 is an explanatory view illustrating the basic configuration of an active gas generation apparatus 101 according to a first embodiment of the present invention. FIG. 1 illustrates an XYZ orthogonal coordinate system. The active gas generation apparatus 101 of the first embodiment is an active gas generation apparatus that generates an active gas 7 obtained by activating a raw material gas 5 supplied to a discharge space 6.

The active gas generation apparatus 101 includes, as the main components, a metal housing 31 and an active gas generation electrode group 51.

The metal housing 31 that is made of metal and has conductivity is a housing for the metal active gas generation apparatus 101 set to the ground potential, and a non-illustrated gas supply port is attached thereto, so that the raw material gas 5 is supplied from the gas supply port to an in-housing space 33 of the metal housing 31.

The metal housing 31 has a central protrusion 31a that partially protrudes upward (+Z direction) such that an active gas passage space 31s for the active gas 7 is formed in the central area of the bottom. The active gas passage space 31s penetrates part of the bottom surface of the metal housing 31, and the central protrusion 31a is provided around the active gas passage space 31s.

An active gas generation electrode group 51 is arranged in the in-housing space 33 that is a raw material gas supply space in the metal housing 31 in the active gas generation apparatus 101. Specifically, the active gas generation electrode group 51 is arranged on the central protrusion 31a including the active gas passage space 31s of the metal housing 31.

The active gas generation electrode group 51 includes a combination of a high-voltage application electrode unit 1 that is a first electrode component and a ground potential electrode unit 2 that is a second electrode component, the ground potential electrode unit 2 being provided below the high-voltage application electrode unit 1.

The high-voltage application electrode unit 1 includes, as the main components, an electrode dielectric film 11 that is a first electrode dielectric film and an electrode conductive film 10 that is a first metal electrode formed on the upper surface of the electrode dielectric film 11. The high-voltage application electrode unit 1 further has an auxiliary conductive film 12 formed, independently of the electrode conductive film 10, on the upper surface of the electrode dielectric film 11, similarly to the base technology illustrated in FIG. 7.

The auxiliary conductive film 12 that is made of metal and has conductivity is provided so as to overlap a gas ejection hole 23 in plan view.

The electrode conductive film 10 and the auxiliary conductive film 12 are provided on the upper surface of the electrode dielectric film 11 by using, for example, a sputtering method or a printing-firing method.

The ground potential electrode unit 2 includes, as the main components, an electrode dielectric film 21 that is a second electrode dielectric film and an electrode conductive film 20 that is a second metal electrode formed on the lower surface of the electrode dielectric film 21.

The active gas generation electrode group 51 is supported by the central protrusion 31a of the metal housing 31 in such a manner that the electrode conductive film 20 of the ground potential electrode unit 2 contacts the upper surface of the central protrusion 31a.

The electrode conductive film 20 is provided on the lower surface of the electrode dielectric film 21 by using a sputtering method, a printing-firing method, or the like.

The electrode dielectric film 11 of the high-voltage application electrode unit 1 and the electrode dielectric film 21 of the ground potential electrode unit 2 are installed such that a predetermined constant interval is provided therebetween by a non-illustrated spacer or the like. This constant interval becomes the gap length of the discharge space 6.

Then, an AC voltage is applied between the electrode conductive film 10 and the electrode conductive film 20 from a high-frequency power supply 9. Specifically, an AC voltage is applied from the high-frequency power supply 9 to the electrode conductive film 10, and the metal housing 31 is set to the ground potential. Additionally, the electrode conductive film 20 and the auxiliary conductive film 12 are also set to the ground potential. The electrode conductive film 20 is set to the ground potential via the metal housing 31, and the auxiliary conductive film 12 is set to the ground potential via the metal housing 31 or other connection means.

In the dielectric space in which the electrode dielectric film 11 and the electrode dielectric film 21 face each other, the discharge space 6 is provided to include an area where the electrode conductive films 10 and 20 overlap each other in plan view.

The upper surface of the electrode dielectric film 11 and the lower surface of the electrode dielectric film 21 may be flat, or may have a predetermined shape. For example, the upper surface of the electrode dielectric film 11 may have an uneven shape that serves as an obstacle that prevents creeping discharge from occurring between the electrode conductive film 10 and the auxiliary conductive film 12.

The electrode dielectric film 21 has the gas ejection hole 23 for ejecting the active gas 7 into the subsequent (lower) processing space 63.

The active gas passage space 31s provided on the bottom surface of the metal housing 31 is provided to be located below the gas ejection hole 23. Therefore, the active gas 7, which has been ejected from the gas ejection hole 23 via a gas ejection opening 65 described later, passes through the active gas passage space 31s and is supplied to the subsequent (lower) processing space 63.

In the active gas generation apparatus 101 having the above-described configuration, the active gas 7 is generated by activating the raw material gas 5 in the discharge space 6 in which a dielectric barrier discharge is generated, and the generated active gas 7 flows through an active gas flow path that is a path from the discharge space 6 to the gas ejection hole 23 in the dielectric space.

The ground potential electrode unit 2 further includes an active gas auxiliary member 60 provided on the upper surface of the electrode dielectric film 21 so as to fill part of the active gas flow path. The active gas auxiliary member 60 has the gas ejection opening 65 located above the gas ejection hole 23. The gas ejection opening 65 is provided to penetrate the active gas auxiliary member 60 along the height direction (Z direction) at the center of the active gas auxiliary member 60, the gas ejection opening 65 becoming part of the active gas flow path.

The formation height of the active gas auxiliary member 60 is set to be lower than the distance (gap length) between the electrode dielectric films 11 and 21. Therefore, a little gap (hereinafter, sometimes abbreviated as an "active gas flow gap") is provided between the upper surface of the active gas auxiliary member 60 and the lower surface of the electrode dielectric film 11 of the high-voltage application electrode unit 1.

As described above, in the active gas generation apparatus 101 of the first embodiment, the active gas auxiliary member 60 provided on the upper surface of the electrode dielectric film 21 fills part of the active gas flow path in the dielectric space, and limits at least part of the active gas flow path to the narrow active gas flow gap.

In the active gas generation apparatus 101 having such a configuration, a dielectric barrier discharge is generated in the discharge space 6 of the active gas generation electrode group 51 by applying an AC voltage between the electrode conductive films 10 and 20. At the same time, the raw material gas 5 is supplied from a non-illustrated gas supply port into the in-housing space 33 of the metal housing 31, so that the raw material gas 5 is made flow from the outer periphery to the inside of the active gas generation electrode group 51. The in-housing space 33 serves as a raw material gas supply space for supplying the raw material gas 5.

Then, the active gas 7 is generated in the active gas generation apparatus 101 by activating the raw material gas 5 in the discharge space 6, and the generated active gas 7 flows through the active gas flow path. At this time, the space volume of the active gas flow path is greatly reduced by such an extent that part of the active gas flow gap is filled with the active gas auxiliary member 60.

The active gas 7, which has passed through the active gas flow gap, passes through the gas ejection opening 65, the gas ejection hole 23, and the active gas passage space 31s, and is finally supplied to the subsequent processing space 63 along the gas flow 15.

The active gas generation apparatus 101 has a first characteristic in which: the auxiliary conductive film 12 to be provided on the upper surface of the electrode dielectric film 11 is provided to overlap part of the active gas flow path in plan view; and the auxiliary conductive film 12 is set to the ground potential.

Additionally, the ground potential electrode unit 2 of the active gas generation apparatus 101 has a second characteristic in which the ground potential electrode unit 2 includes the active gas auxiliary member 60 that fills part of the active gas flow path between the discharge space 6 and the gas ejection hole 23 in the dielectric space in order to limit to the active gas flow gap.

Since the active gas generation apparatus 101 of the first embodiment has the first characteristic, the electric field strength in the active gas flow path can be released by the auxiliary conductive film 12 set to the ground potential.

Further, the active gas generation apparatus 101 of the first embodiment has the second characteristic, and hence the space volume of the active gas flow path is reduced by such an extent that the part of the active gas flow path is filled with the active gas auxiliary member 60, so that the time during which the active gas 7 passes through the active gas flow path can be shortened to such an extent that the active gas 7 does not deactivate.

As a result, the active gas generation apparatus 101 of the first embodiment has effects in which: the electric field strength in the active gas flow path can be released; and the deactivation amount of the active gas passing through the active gas flow path can be minimized.

Furthermore, the active gas flow gap formed on the upper surface of the active gas auxiliary member 60 can be provided with an orifice function by sufficiently narrowing the active gas flow gap, that is, by sufficiently shortening the length in the height direction (Z direction) of the active gas flow gap. By providing an orifice function to the active gas flow gap, a pressure difference can be created between the processing space 63 after (below) the active gas generation apparatus 101 and the discharge space 6, whereby the pressure in the processing space 63 can be sufficiently reduced.

At this time, the processing space 63 is set to a sufficiently low electric field strength, and hence dielectric breakdown can be prevented even in the processing space 63 under a relatively low pressure environment.

Additionally, it is not necessary to provide the orifice part 40 after the gas ejection hole 23, as in the base technology illustrated in FIG. 7.

As specific configurations for achieving the basic configuration of the active gas generation apparatus 101 of the first embodiment illustrated in FIG. 1, a first aspect and a second aspect described below can be considered.

(First Aspect)

Figure 2:
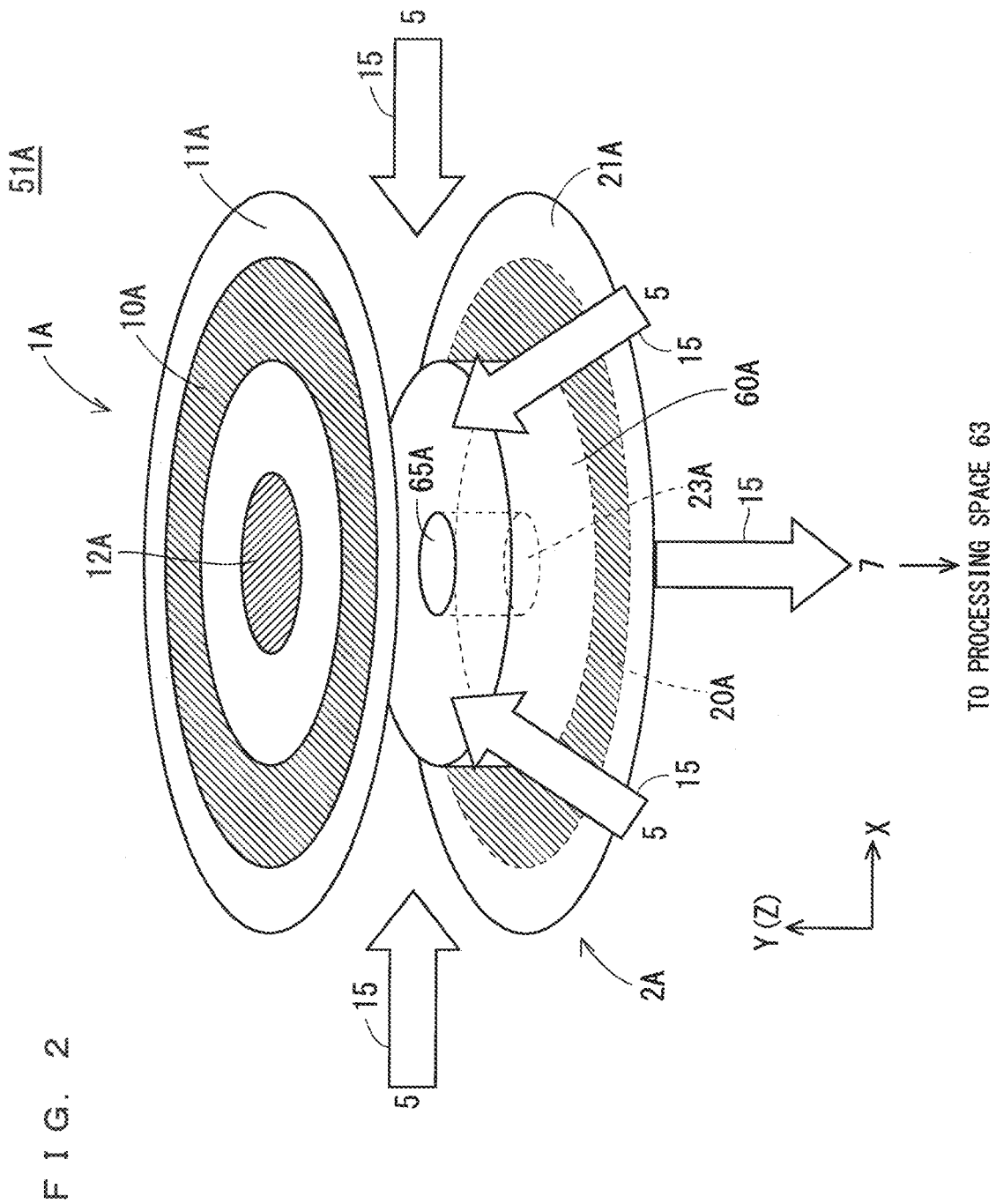
FIG. 2 is an explanatory view schematically illustrating the entire configuration of an active gas generation electrode group of a first aspect of the first embodiment.

FIG. 2 is an explanatory view schematically illustrating the entire configuration of an active gas generation electrode group 51A of the first aspect in the active gas generation apparatus 101 of the first embodiment. FIG. 2 illustrates an XYZ orthogonal coordinate system.

The first aspect of the active gas generation apparatus 101 adopts the active gas generation electrode group 51A illustrated in FIG. 2, as the active gas generation electrode group 51 in the basic configuration illustrated in FIG. 1.

As illustrated in FIG. 2, the active gas generation electrode group 51A includes a combination of a high-voltage application electrode unit 1A that is a first electrode component and a ground potential electrode unit 2A that is a second electrode component. The ground potential electrode unit 2A is provided below the high-voltage application electrode unit 1A. As illustrated in FIG. 2, the active gas generation electrode group 51A adopts a parallel plate type.

The high-voltage application electrode unit 1A includes, as the main components, an electrode dielectric film 11A that is a first electrode dielectric film and an electrode conductive film 10A that is a first metal electrode formed on the upper surface of the electrode dielectric film 11A. The high-voltage application electrode unit 1A further has an auxiliary conductive film 12A formed, independently of the electrode conductive film 10A, on the upper surface of the electrode dielectric film 11A.

As illustrated in FIG. 2, the electrode dielectric film 11A is formed in a disk shape (cylindrical shape), that is, in a circular shape in plan view, the electrode conductive film 10A is formed in an annular shape in plan view, and the auxiliary conductive film 12A is formed in a disk shape. The auxiliary conductive film 12A is arranged on the central portion of the electrode dielectric film 11A so as to overlap a gas ejection hole 23A in plan view. The electrode conductive film 10A is arranged at a predetermined distance from the outer periphery of the auxiliary conductive film 12A so as to surround the periphery of the auxiliary conductive film 12A.

On the other hand, the ground potential electrode unit 2A has, as the main components, an electrode dielectric film 21A that is a second electrode dielectric film and an electrode conductive film 20A that is a second metal electrode formed on the lower surface of the electrode dielectric film 21A.

In the dielectric space in which the electrode dielectric film 11A and the electrode dielectric film 21A face each other, a discharge space 6 is provided to include an area where the electrode conductive films 10A and 20A overlap each other in plan view.

The electrode dielectric film 21A has, in its central portion, a single gas ejection hole 23A that is used for ejecting the active gas 7 to the external processing space 63 and penetrates the electrode dielectric film 21A. The gas ejection hole 23A corresponds to the gas ejection hole 23 in the basic configuration illustrated in FIG. 1.

The electrode dielectric film 21A is formed in a disk shape, the electrode conductive film 20A is formed in an annular shape in plan view, and the single gas ejection hole 23A is formed in a circular shape in plan view. The gas ejection hole 23A is provided at the center of the electrode dielectric film 21A in plan view.

In the ground potential electrode unit 2A, an active gas auxiliary member 60A is provided on the upper surface of the electrode dielectric film 21A so as to fill part of the active gas flow path, as illustrated in FIG. 2. The active gas auxiliary member 60A has a gas ejection opening 65A located above the gas ejection hole 23A. The gas ejection opening 65A is provided from the upper surface to the lower surface of the active gas auxiliary member 60A so as to penetrate the center of the active gas auxiliary member 60A, the gas ejection opening 65A becoming part of the active gas flow path.

The formation height of the active gas auxiliary member 60A is set to be lower than the distance (gap length) between the electrode dielectric films 11A and 21A. Therefore, the active gas flow gap is provided between the upper surface of the active gas auxiliary member 60A and the lower surface of the electrode dielectric film 11A of the high-voltage application electrode unit 1A.

As described above, the active gas auxiliary member 60A of the first aspect of the first embodiment fills part of the active gas flow path between the discharge space 6 and the gas ejection hole 23A in the dielectric space in order to limit at least part of the active gas flow path to the narrow active gas flow gap.

As described above, the active gas auxiliary member 60A has the gas ejection opening 65A at its center, and is formed in a disk shape including the gas ejection opening 65A. That is, the gas ejection opening 65A is provided so as to almost completely overlap the single gas ejection hole 23A in plan view. Therefore, the active gas auxiliary member 60A is formed in an annular shape in plan view.

As described above, the ground potential electrode unit 2A of the first aspect of the active gas generation apparatus 101 further includes the active gas auxiliary member 60A that fills part of the active gas flow path in the dielectric space between the electrode dielectric films 11A and 21A in order to limit at least part of the active gas flow path to the active gas flow gap.

The electrode conductive film 20A is arranged in an annular shape so as to surround the active gas auxiliary member 60A in plan view and so as to be along the outer periphery of the active gas auxiliary member 60A in plan view.

In the first aspect having the above-described configuration, a path from the discharge space 6 to the single gas ejection hole 23A in the dielectric space formed between the electrode dielectric films 11A and 21A is defined as the active gas flow path.

As illustrated in FIG. 2, the auxiliary conductive film 12A is arranged at a position where the auxiliary conductive film 12A overlaps the gas ejection hole 23A in plan view. That is, the auxiliary conductive film 12A is arranged to overlap at least part of the active gas flow path in plan view.

And, an AC voltage is applied between the electrode conductive film 10A and the electrode conductive film 20A from the high-frequency power supply 9. Specifically, an AC voltage is applied to the electrode conductive film 10A from the high-frequency power supply 9, and the metal housing 31 is set to the ground potential. Additionally, the electrode conductive film 20A and the auxiliary conductive film 12A are also set to the ground potential. The electrode conductive film 20A is set to the ground potential via the metal housing 31, and the auxiliary conductive film 12A is set to the ground potential via the metal housing 31 or other connection means.

As described above, the first aspect of the active gas generation apparatus 101 has a characteristic in which: the auxiliary conductive film 12A is provided to overlap part of the active gas flow path in plan view; and the auxiliary conductive film 12A is set to the ground potential. That is, the first aspect of the first embodiment has the first characteristic, similarly to the basic configuration of the first embodiment.

The first aspect of the active gas generation apparatus 101 having such a configuration generates a dielectric barrier discharge in the discharge space 6 of the active gas generation electrode group 51A by applying an AC voltage between the electrode conductive films 10A and 20A. At the same time, the first aspect of the active gas generation apparatus 101 supplies the raw material gas 5 from a non-illustrated gas supply port into the in-housing space 33 of the metal housing 31, so that the raw material gas 5 is made flow as the gas flow 15 going in the direction from the outer periphery to the single gas ejection hole 23A of the active gas generation electrode group 51A.

In the first aspect of the active gas generation apparatus 101, the active gas 7 is then generated by activating the raw material gas 5 in the discharge space 6, and the generated active gas 7 flows through the active gas flow path that is a path from the discharge space 6 to the single gas ejection hole 23A in the dielectric space.

At this time, the space volume of the active gas flow path is greatly reduced by such an extent that the part of the active gas flow path is filled with the active gas auxiliary member 60A.

The active gas 7, which has passed through the active gas flow gap, passes through the gas ejection opening 65A, the gas ejection hole 23A, and the active gas passage space 31s, and is finally supplied to the subsequent processing space 63 along the gas flow 15.

In the first aspect of the first embodiment, an orifice function can be provided to the active gas flow gap formed on the upper surface of the active gas auxiliary member 60A by sufficiently narrowing the active gas flow gap, similarly to the basic configuration of the first embodiment.

In the first aspect of the first embodiment, a pressure difference is created between the processing space 63 after (below) the active gas generation apparatus 101 and the discharge space 6 by providing an orifice function to the active gas flow gap, whereby the pressure in the processing space 63 can be sufficiently reduced.

(Second Aspect)

Figure 3:
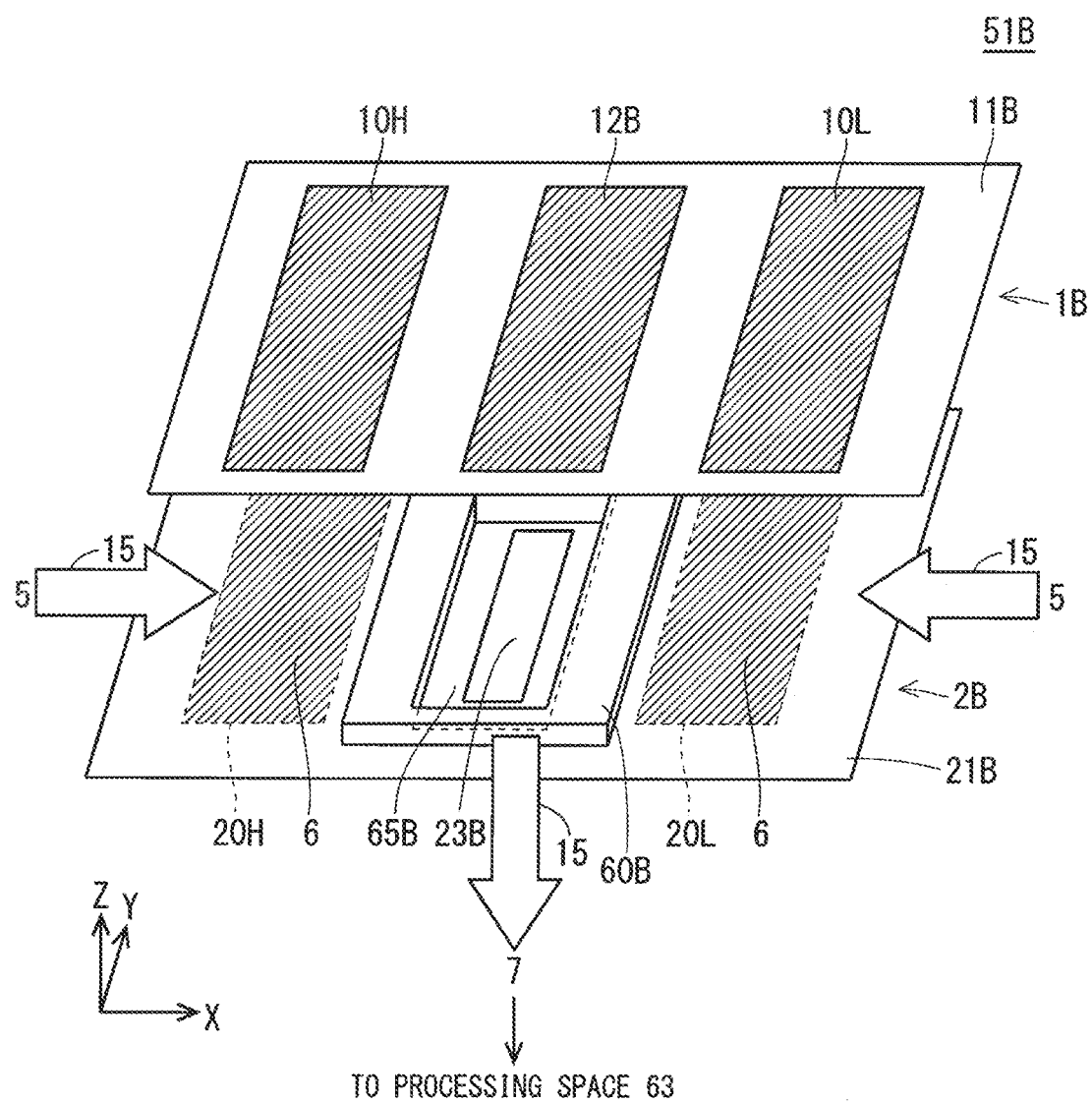
FIG. 3 is an explanatory view schematically illustrating the entire configuration of an active gas generation electrode group of a second aspect of the first embodiment.

FIG. 3 is an explanatory view schematically illustrating the entire structure of an active gas generation electrode group 51B of a second aspect of the active gas generation apparatus 101 of the first embodiment. FIG. 3 illustrates an XYZ orthogonal coordinate system.

The second aspect of the active gas generation apparatus 101 adopts the active gas generation electrode group 51B illustrated in FIG. 3, as the active gas generation electrode group 51 in the basic configuration illustrated in FIG. 1.

Hereinafter, the active gas generation electrode group 51B of the second aspect will be described with appropriate reference to FIG. 3.

As illustrated in FIG. 3, the active gas generation electrode group 51B includes a combination of a high-voltage application electrode unit 1B that is a first electrode component and a ground potential electrode unit 2B that is a second electrode component. The ground potential electrode unit 2B is provided below the high-voltage application electrode unit 1B. As illustrated in FIG. 3, the active gas generation electrode group 51B adopts a parallel plate type.

The high-voltage application electrode unit 1B includes, as the main components, an electrode dielectric film 11B that is a first electrode dielectric film and an electrode conductive film pair 10H and 10L that are first metal electrodes formed on the upper surface of the electrode dielectric film 11B. The high-voltage application electrode unit 1B further has an auxiliary conductive film 12B formed, independently of the electrode conductive film pair 10H and 10L, on the upper surface of the electrode dielectric film 11B.

As illustrated in FIG. 3, the electrode dielectric film 11B is formed in a rectangular shape having a long side in the X direction in plan view, each of the electrode conductive film pair 10H and 10L is formed in a rectangular shape having a long side in the Y direction in plan view, and the auxiliary conductive film 12B is formed in a rectangular shape having a long side in the Y direction in plan view. The auxiliary conductive film 12B is arranged, in plan view, on the center in the X direction of the electrode dielectric film 11B.

The electrode conductive film pair 10H and 10L are arranged at a predetermined distance from the auxiliary conductive film 12B so as to sandwich the auxiliary conductive film 12B. That is, the electrode conductive film 10H is arranged on the left side (−X direction side) of the auxiliary conductive film 12B, while the electrode conductive film 10L is arranged on the right side (+X direction side) of the auxiliary conductive film 12B.

On the other hand, the ground potential electrode unit 2B includes, as the main components, an electrode dielectric film 21B that is a second electrode dielectric film and an electrode conductive film pair 20H and 20L that are second metal electrodes formed on the lower surface of the electrode dielectric film 21B.

In the dielectric space in which the electrode dielectric film 11B and the electrode dielectric film 21B face each other, a discharge space 6 is provided to include an area where the electrode conductive films 10H and 10L and the electrode conductive films 20H and 20L respectively overlap each other in plan view.

As illustrated in FIG. 3, the electrode dielectric film 21B is formed in a rectangular shape having a long side in the X direction in plan view.

The electrode dielectric film 21B has a single gas ejection hole 23B for ejecting an active gas 7 into an external processing space 63, the gas ejection hole 23B penetrating the electrode dielectric film 21B. The single gas ejection hole 23B corresponds to the gas ejection hole 23 in the basic configuration illustrated in FIG. 1. The single gas ejection hole 23B is formed in a rectangular shape having a long side in the Y direction in plan view.

The electrode dielectric film 21B is formed in a rectangular shape having a long side in the X direction in plan view, each of the electrode conductive films 20H and 20L is formed in a rectangular shape having a long side in the Y direction in plan view, and the single gas ejection hole 23B is formed in a rectangular shape having a long side in the Y direction in plan view. The gas ejection hole 23B is provided at the center of the electrode dielectric film 21B in plan view.

In the ground potential electrode unit 2B, the active gas auxiliary member 60B is provided on the upper surface of the electrode dielectric film 21B so as to fill part of the active gas flow path, as illustrated in FIG. 3. The active gas auxiliary member 60B has a gas ejection opening 65B located above the gas ejection hole 23B. The gas ejection opening 65B is provided from the upper surface to the lower surface of the active gas auxiliary member 60B so as to penetrate the center of the active gas auxiliary member 60B, the gas ejection opening 65B becoming part of the active gas flow path.

The formation height of the active gas auxiliary member 60B is set to be lower than the distance (gap length) between the electrode dielectric films 11B and 21B. Therefore, the active gas flow gap is provided between the upper surface of the active gas auxiliary member 60B and the lower surface of the electrode dielectric film 11B of the high-voltage application electrode unit 1B.

As described above, the active gas auxiliary member 60B of the second aspect of the first embodiment fills part of the active gas flow path between the discharge space 6 and the gas ejection hole 23B in the dielectric space in order to limit at least part of the active gas flow path to the narrow active gas flow gap.

As described above, the active gas auxiliary member 60B has the gas ejection opening 65B at its center, and is formed in a rectangular shape including the gas ejection opening 65B. That is, the gas ejection opening 65B is provided to include the entire of the single gas ejection hole 23B in plan view and to overlap the gas ejection hole 23B. Therefore, the active gas auxiliary member 60B is formed in a rectangular shape including the entire of the gas ejection opening 65B in plan view.

As described above, the ground potential electrode unit 2B of the second aspect of the active gas generation apparatus 101 further includes the active gas auxiliary member 60B that fills part of the active gas flow path in the dielectric space between the electrode dielectric films 11B and 21B in order to limit at least part of the active gas flow path to the active gas flow gap.

The electrode conductive film pair 20H and 20L are arranged to sandwich the active gas auxiliary member 60B. The electrode conductive film 20H is arranged on the left side (−X direction side) of the active gas auxiliary member 60B, while the electrode conductive film 20L is arranged on the right side (+X direction side) of the active gas auxiliary member 60B.

In the second aspect having the above-described configuration, a path from the discharge space 6 to the gas ejection hole 23B in the dielectric space formed between the electrode dielectric films 11B and 21B is defined as the active gas flow path.

As illustrated in FIG. 3, the auxiliary conductive film 12B is arranged at a position where the auxiliary conductive film 12B overlaps the single gas ejection hole 23B in plan view. That is, the auxiliary conductive film 12B is arranged to overlap part of the active gas flow path in plan view.

And, an AC voltage is applied between the electrode conductive film pair 10H and 10L and the electrode conductive film pair 20H and 20L from the high-frequency power supply 9. Specifically, an AC voltage is applied to the electrode conductive film pair 10H and 10L from the high-frequency power supply 9, and the metal housing 31 is set to the ground potential. Additionally, the electrode conductive films 20H and 20L and the auxiliary conductive film 12B are also set to the ground potential. The electrode conductive films 20H and 20L are set to the ground potential via the metal housing 31, and the auxiliary conductive film 12B is set to the ground potential via the metal housing 31 or other connection means.

An active gas passage space 31s of the metal housing 31 is provided below the single gas ejection hole 23B. Therefore, the active gas 7, which has passed through the gas ejection opening 65B and the gas ejection hole 23B, further passes through the active gas passage space 31s, and is supplied to the subsequent (lower) processing space 63.

As described above, the second aspect of the active gas generation apparatus 101 has a characteristic in which: the auxiliary conductive film 12B is provided to overlap part of the active gas flow path in plan view; and the auxiliary conductive film 12B is set to the ground potential. That is, the second aspect of the first embodiment has the first characteristic, similarly to the basic configuration of the first embodiment.

The second aspect of the active gas generation apparatus 101 having such a configuration generates a dielectric barrier discharge in the discharge space 6 of the active gas generation electrode group 51B by applying an AC voltage between the electrode conductive film pair 10H and 10L and the electrode conductive film pair 20H and 20L. Additionally, the second aspect of the active gas generation apparatus 101 supplies the raw material gas 5 from a non-illustrated gas supply port into the in-housing space 33 of the metal housing 31, so that the raw material gas 5 is made flow inside along the gas flow 15 parallel to the X direction from both the ends in the X direction of the active gas generation electrode group 51B.

In the second aspect of the active gas generation apparatus 101, the active gas 7 is then generated by activating the raw material gas 5 in the discharge space 6, and the generated active gas 7 flows through an active gas flow path that is a path from the discharge space 6 to the gas ejection hole 23B in the dielectric space.

At this time, the space volume of the active gas flow path is greatly reduced by such an extent that the part of the active gas flow path is filled with the active gas auxiliary member 60B.

The active gas 7, which has passed through the active gas flow gap, passes through the gas ejection opening 65B, the gas ejection hole 23B, and the active gas passage space 31s, and is finally supplied to the subsequent processing space 63 along the gas flow 15.

In the second aspect of the first embodiment, the active gas flow gap formed on the upper surface of the active gas auxiliary member 60B is sufficiently narrowed, whereby an orifice function can be provided to the active gas flow gap, similarly to the basic configuration of the first embodiment.

In the second aspect of the first embodiment, a pressure difference is created between the processing space 63 after (below) the active gas generation apparatus 101 and the discharge space 6 by providing an orifice function to the active gas flow gap, whereby the pressure in the processing space 63 can be sufficiently reduced.

Second Embodiment (Basic Configuration)

Figure 4:
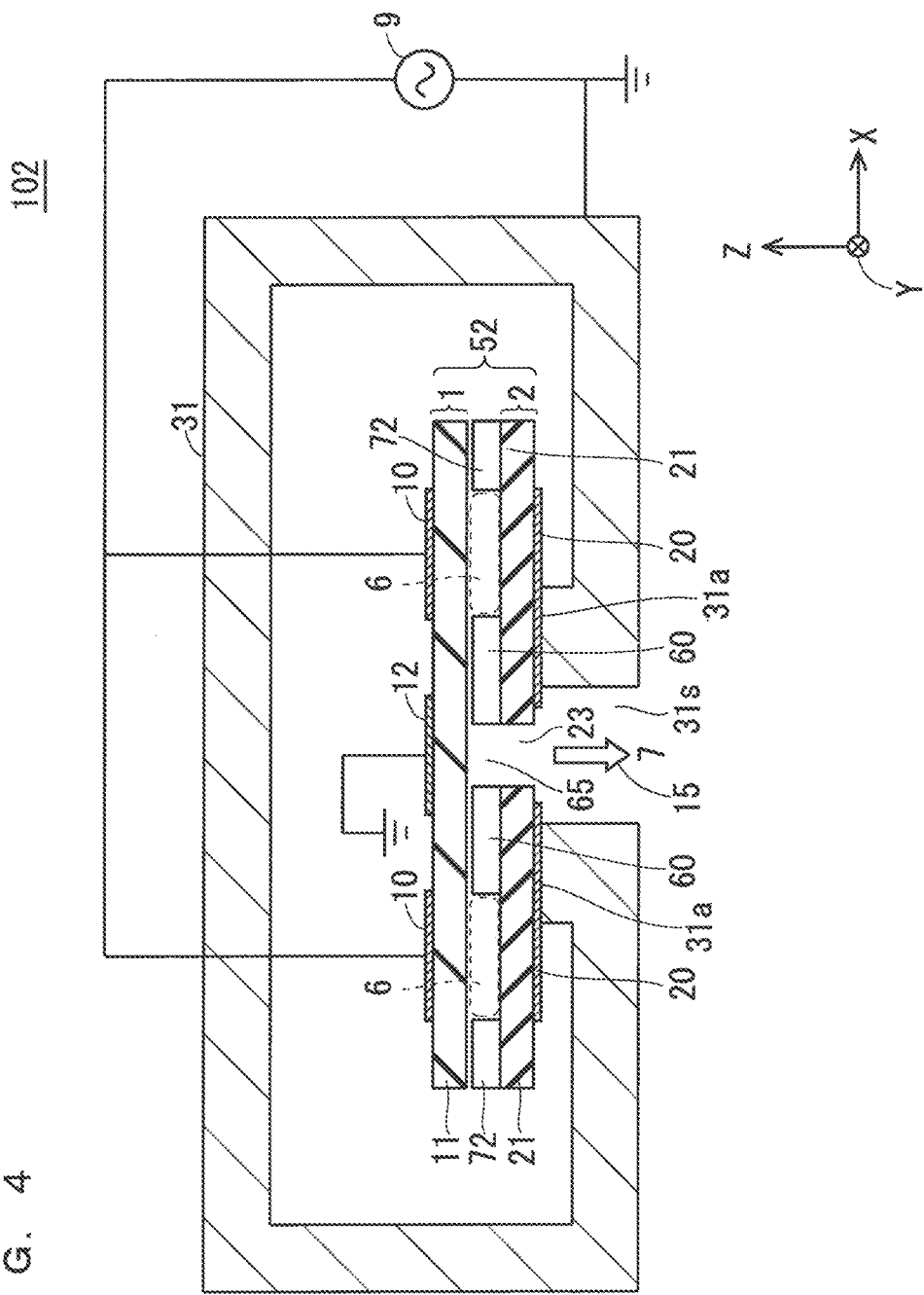
FIG. 4 is an explanatory view illustrating the basic configuration of an active gas generation apparatus according to a second embodiment of the present invention.

FIG. 4 is an explanatory view illustrating the basic configuration of an active gas generation apparatus 102 according to a second embodiment of the present invention. FIG. 4 illustrates an XYZ orthogonal coordinate system. The active gas generation apparatus 102 of the second embodiment is an active gas generation apparatus that generates an active gas 7 obtained by activating a raw material gas 5 supplied to a discharge space 6.

Hereinafter, the same configurations and operations as those of the active gas generation apparatus 101 of the first embodiment illustrated in FIGS. 1 to 3 are denoted by the same reference signs, and the description thereof will be appropriately omitted, so the characteristic parts of the active gas generation apparatus 102 of the second embodiment will be mainly described.

The active gas generation apparatus 102 includes, as the main components, a metal housing 31 and an active gas generation electrode group 52.

In the active gas generation apparatus 102, the active gas 7 is generated by activating the raw material gas 5 in the discharge space 6, and the generated active gas 7 flows through an active gas flow path that is a path from the discharge space 6 to a gas ejection hole 23 in the dielectric space.

In a ground potential electrode unit 2, an active gas auxiliary member 60 having a gas ejection opening 65 above the gas ejection hole 23 is provided on the upper surface of an electrode dielectric film 21, similarly to the first embodiment. The active gas auxiliary member 60 is provided on the upper surface of the electrode dielectric film 21 such that the narrow active gas flow gap is created between the upper surface of the active gas auxiliary member 60 and the lower surface of an electrode dielectric film 11 of a high-voltage application electrode unit 1.

As described above, the ground potential electrode unit 2 of the active gas generation apparatus 102 of the second embodiment further includes the active gas auxiliary member 60 that fills part of the active gas flow path in the dielectric space in order to limit to the active gas flow gap, similarly to the first embodiment.

Additionally, the ground potential electrode unit 2 of the active gas generation apparatus 102 further has a raw material gas auxiliary member 72 on the upper surface of the electrode dielectric film 21.

In the dielectric space in which the raw material gas 5 supplied to the in-housing space 33 flows from the outer periphery of the active gas generation electrode group 52 to the dielectric space between the electrode dielectric films 11, 21, a path leading to a point where the raw material gas 5 reaches the discharge space 6 is defined as a raw material gas flow path.

The formation height of the raw material gas auxiliary member 72 is set to be lower than the distance (gap length) between the electrode dielectric films 11 and 21, and to be substantially the same as the formation height of the active gas auxiliary member 60. Therefore, a gap (hereinafter, may be abbreviated as a "raw material gas flow gap") is narrowly created between the upper surface of the raw material gas auxiliary member 72 and the lower surface of the electrode dielectric film 11 of the high-voltage application electrode unit 1.

Therefore, the raw material gas auxiliary member 72 fills part of the raw material gas flow path in the dielectric space, and limits to the raw material gas flow gap.

The active gas generation apparatus 102 having such a configuration generates a dielectric barrier discharge in the discharge space 6 of the active gas generation electrode group 52 by applying an AC voltage between the electrode conductive films 10 and 20, and simultaneously supplies the raw material gas 5 from a non-illustrated gas supply port into the in-housing space 33 of the metal housing 31, so that the raw material gas 5 is made flow from the outer periphery to the inside of the active gas generation electrode group 52.

Then, the raw material gas 5 reaches the discharge space 6 via the raw material gas flow path of the active gas generation apparatus 102. At this time, the raw material gas flow path is limited to the raw material gas flow gap above the raw material gas auxiliary member 72.

After the raw material gas 5 reaches the discharge space 6, the active gas 7 is generated by activating the raw material gas 5 in the discharge space 6, and the generated active gas 7 flows through the active gas flow path. At this time, the active gas flow path is limited to the active gas flow gap above the active gas auxiliary member 60.

The active gas 7, which has passed through the active gas flow gap, passes through the gas ejection opening 65, the gas ejection hole 23, and the active gas passage space 31s, and is finally supplied to the subsequent processing space 63 along the gas flow 15.

In the active gas generation apparatus 102 of the second embodiment, an auxiliary conductive film 12 is provided to overlap part of the active gas flow path in plan view, as described above.

Similarly to the first embodiment, the active gas generation apparatus 102 of the second embodiment has a first characteristic in which: the auxiliary conductive film 12 is provided to overlap part of the active gas flow path in plan view; and the auxiliary conductive film 12 is set to the ground potential.

Additionally, the active gas generation apparatus 102 has a second characteristic in which the active gas generation apparatus 102 further includes the active gas auxiliary member 60 that fills part of the active gas flow path between the discharge space 6 and the gas ejection hole 23 in the dielectric space in order to limit to the active gas flow gap, similarly to the first embodiment.

By having the first and second characteristics, the active gas generation apparatus 102 of the second embodiment has effects in which: the electric field strength in the active gas flow path can be released; and the deactivation amount of the active gas passing through the active gas flow path can be minimized, similarly to the first embodiment.

Additionally, the active gas generation apparatus 102 of the second embodiment has, in addition to the first and second characteristics, a third characteristic in which the ground potential electrode unit 2 further includes the raw material gas auxiliary member 72 that fills part of the raw material gas flow path in the dielectric space in order to limit to the raw material gas flow gap.

Since the active gas generation apparatus 102 of the second embodiment has the third characteristic, the narrow raw material gas flow gap can be formed in at least part of the raw material gas flow path by filling part of the raw material gas flow path with the raw material gas auxiliary member 72.

By forming the raw material gas flow gap so as to be sufficiently narrow, that is, by sufficiently shortening the length in the height direction (Z direction), an orifice function can be provided to the raw material gas flow gap. With this orifice function, a desired pressure difference can be set between the discharge space 6 and the in-housing space 33 outside the discharge space 6, that serves as a raw material gas supply space for supplying raw material gas.

As a result, in the active gas generation apparatus 102 of the second embodiment, the pressure in the discharge space 6 can be set to be relatively low even if the pressure in the in-housing space 33, which is located before the discharge space 6 and serves as the raw material gas supply space, is sufficiently increased.

Therefore, dielectric breakdown of the gas in the in-housing space 33 can be effectively suppressed by sufficiently increasing the pressure in the in-housing space 33.

Additionally, the active gas generation apparatus 102 can be downsized by forming the in-housing space 33 so as to be relatively narrow, while the effect of suppressing dielectric breakdown in the in-housing space 33 is being maintained.

Further, the pressure in the discharge space 6 can be set to be relatively low by providing an orifice function to the raw material gas flow gap formed above the raw material gas auxiliary member 72.

A case is considered where for example, nitrogen molecules are converted into nitrogen atoms, as the active gas 7. In this case, the nitrogen atoms deactivate due to collision with other nitrogen atoms, and hence the deactivation amount of the nitrogen atoms serving as the active gas 7 can be effectively reduced by setting the pressure in the discharge space 6 to be relatively low.

As specific configurations by which the basic configuration of the active gas generation apparatus 102 of the second embodiment illustrated in FIG. 4 is achieved, a first aspect and a second aspect described below can be considered.

(First Aspect)

Figure 5:
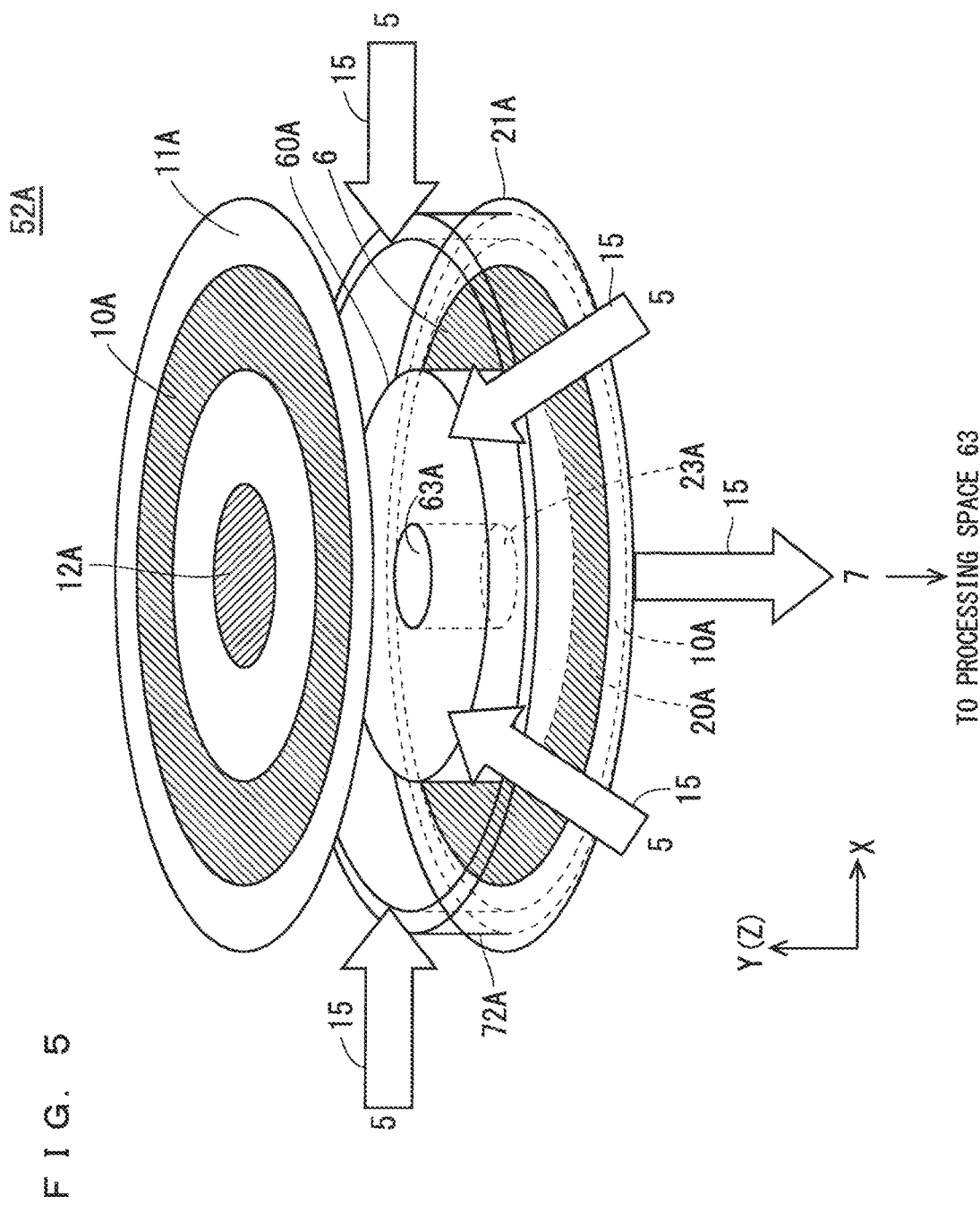
FIG. 5 is an explanatory view schematically illustrating the entire configuration of an active gas generation electrode group of a first aspect of the second embodiment.

FIG. 5 is an explanatory view schematically illustrating the entire configuration of an active gas generation electrode group 52A of a first aspect of the active gas generation apparatus 102 of the second embodiment. FIG. 5 illustrates an XYZ orthogonal coordinate system.

The first aspect of the active gas generation apparatus 102 adopts the active gas generation electrode group 52A illustrated in FIG. 5, as the active gas generation electrode group 52 having the basic configuration illustrated in FIG. 4.

As illustrated in FIG. 5, the first aspect of the second embodiment further includes an active gas auxiliary member 60A that fills part of the active gas flow path between the discharge space 6 and the gas ejection hole 23A in the dielectric space between the electrode dielectric films 11A and 21A in order to limit to the active gas flow gap, similarly to the first aspect of the first embodiment.

An electrode conductive film 20A is arranged along the outer periphery of the active gas auxiliary member 60A so as to surround the active gas auxiliary member 60A in plan view.

Additionally, in the second aspect of the second embodiment, a raw material gas auxiliary member 72A corresponding to the raw material gas auxiliary member 72 in the basic configuration is provided, at a predetermined distance from the active gas auxiliary member 60A, on the upper surface of the electrode dielectric film 21A so as to surround the electrode conductive film 20A in plan view. The raw material gas auxiliary member 72A is provided to have an annular shape in plan view along the outer periphery of the electrode dielectric film 21A and to have a formation height substantially the same as the active gas auxiliary member 60A.

The formation height of the raw material gas auxiliary member 72A is set to be lower than the distance (gap length) between the electrode dielectric films 11A and 21A. Therefore, the raw material gas flow gap is provided between the upper surface of the raw material gas auxiliary member 72A and the lower surface of the electrode dielectric film 11A of the high-voltage application electrode unit 1.

As described above, the raw material gas auxiliary member 72A is provided to fill part of the raw material gas flow path in the dielectric space in order to limit to the raw material gas flow gap.

In the first aspect of the second embodiment having the above-described configuration, a path from the discharge space 6 to a single gas ejection hole 23A in the dielectric space formed between the electrode dielectric films 11A and 21A is defined as the active gas flow path.

As illustrated in FIG. 5, the auxiliary conductive film 12A is arranged at a position where the auxiliary conductive film 12A overlaps the gas ejection hole 23A in plan view. That is, the auxiliary conductive film 12A is arranged to overlap part of the active gas flow path in plan view.

And, an AC voltage is applied between the electrode conductive film 10A and the electrode conductive film 20A from the high-frequency power supply 9. Specifically, an AC voltage is applied to the electrode conductive film 10A from the high-frequency power supply 9, and the metal housing 31 is set to the ground potential. Additionally, the electrode conductive film 20A and the auxiliary conductive film 12A are also set to the ground potential. The electrode conductive film 20A is set to the ground potential via the metal housing 31, and the auxiliary conductive film 12A is set to the ground potential via the metal housing 31 or other connection means.

As described above, the first aspect of the active gas generation apparatus 102 has a characteristic in which: the auxiliary conductive film 12A is provided to overlap part of the active gas flow path in plan view; and the auxiliary conductive film 12A is set to the ground potential. That is, the first aspect of the second embodiment has the first characteristic, similarly to the basic configuration of the second embodiment.

The first aspect of the active gas generation apparatus 102 having such a configuration generates a dielectric barrier discharge in the discharge space 6 of the active gas generation electrode group 52A by applying an AC voltage between the electrode conductive films 10A and 20A. At the same time, the first aspect of the active gas generation apparatus 102 supplies the raw material gas 5 from a non-illustrated gas supply port into the in-housing space 33 of the metal housing 31, so that the raw material gas 5 is made flow as the gas flow 15 going in the direction from the outer periphery to the single gas ejection hole 23A of the active gas generation electrode group 52A.

Then, the raw material gas 5 reaches the discharge space 6 via the raw material gas flow path formed above the raw material gas auxiliary member 72A, at least part of the raw material gas flow path being limited to the raw material gas flow gap.

At this time, by sufficiently narrowing the raw material gas flow gap formed above the raw material gas auxiliary member 72A, that is, by sufficiently shortening the length in the height direction (Z direction) of the raw material gas flow gap, an orifice function can be provided to the raw material gas flow gap. With this orifice function, a desired pressure difference can be set between the discharge space 6 and the in-housing space 33 outside the discharge space 6, that serves as a raw material gas supply space for supplying raw material gas.

Therefore, in the first aspect of the second embodiment, the pressure in the discharge space 6 can be set to be relatively low even if the pressure in the in-housing space 33 located before the discharge space 6 is sufficiently increased.

In the first aspect of the active gas generation apparatus 102, the active gas 7 is then generated by activating the raw material gas 5 in the discharge space 6, and the generated active gas 7 flows through the active gas flow path that is a path from the discharge space 6 to the single gas ejection hole 23A in the dielectric space.

At this time, the space volume of the active gas flow path is reduced by such an extent that the part of the active gas flow path is filled with the active gas auxiliary member 60A.

The active gas 7, which has passed through the active gas flow gap, passes through the gas ejection opening 65A, the single gas ejection hole 23A, and the active gas passage space 31s, and is finally supplied to the subsequent processing space 63 along the gas flow 15.

(Second Aspect)

FIG. 6 is an explanatory view schematically illustrating the entire structure of an active gas generation electrode group 52B of a second aspect of the active gas generation apparatus 102 of the second embodiment. FIG. 6 illustrates an XYZ orthogonal coordinate system.

The second aspect of the active gas generation apparatus 102 adopts the active gas generation electrode group 52B illustrated in FIG. 6, as the active gas generation electrode group 52 in the basic configuration illustrated in FIG. 4.

Hereinafter, the active gas generation electrode group 52B of the second aspect will be described with appropriate reference to FIG. 6.

As illustrated in FIG. 6, the second aspect of the second embodiment further includes an active gas auxiliary member 60B that fills part of the active gas flow path in the dielectric space between the electrode dielectric films 11B and 21B in order to limit to the active gas flow gap, similarly to the second aspect of the first embodiment.

The electrode conductive film pair 20H and 20L are arranged to sandwich the active gas auxiliary member 60B. The electrode conductive film 20H is arranged on the left side (−X direction side) of the active gas auxiliary member 60B, while the electrode conductive film 20L is arranged on the right side (+X direction side) of the active gas auxiliary member 60B.

Additionally, a raw material gas auxiliary member 72B corresponding to the raw material gas auxiliary member 72 in the basic configuration is provided, at a predetermined distance from the active gas auxiliary member 60B, on the upper surface of the electrode dielectric film 21B so as to surround the active gas auxiliary member 60B and the electrode conductive films 20H and 20L in plan view. The raw material gas auxiliary member 72B is provided in a rectangular frame shape in plan view so as to be along the outer periphery of the electrode dielectric film 21B.

The raw material gas auxiliary member 72B is provided on the electrode dielectric film 21B so as to have a formation height substantially the same as the active gas auxiliary member 60B, so that the raw material gas flow gap is created between the upper surface of the raw material gas auxiliary member 72B and the lower surface of the electrode dielectric film 11B of the high-voltage application electrode unit 1. That is, the formation height of the active gas auxiliary member 60B is set to be lower than the distance (gap length) between the electrode dielectric films 11B and 21B.

As described above, the raw material gas auxiliary member 72B is provided to fill part of the raw material gas flow path in the dielectric space in order to limit to the raw material gas flow gap.

In the second aspect of the second embodiment having the above-described configuration, a path from the discharge space 6 to the gas ejection hole 23B in the dielectric space formed between the electrode dielectric films 11B and 21B is defined as the active gas flow path.

As illustrated in FIG. 6, the auxiliary conductive film 12B is arranged at a position where the auxiliary conductive film 12B overlaps the single gas ejection hole 23B in plan view. That is, the auxiliary conductive film 12B is arranged to overlap part of the active gas flow path in plan view.

And, an AC voltage is applied between the electrode conductive film pair 10H and 10L and the electrode conductive film pair 20H and 20L from the high-frequency power supply 9. Specifically, an AC voltage is applied to the electrode conductive film pair 10H and 10L from the high-frequency power supply 9, and the metal housing 31 is set to the ground potential. Additionally, the electrode conductive films 20H and 20L and the auxiliary conductive film 12B are also set to the ground potential. The electrode conductive films 20H and 20L are set to the ground potential via the metal housing 31, and the auxiliary conductive film 12B is set to the ground potential via the metal housing 31 or other connection means.

An active gas passage space 31s of the metal housing 31 is provided below the single gas ejection hole 23B. Therefore, the active gas 7, which has passed through the single gas ejection hole 23B, passes through the active gas passage space 31s, and is supplied to the subsequent (lower) processing space 63.

As described above, the second aspect of the active gas generation apparatus 102 has a characteristic in which: the auxiliary conductive film 12B is provided to overlap part of the active gas flow path in plan view; and the auxiliary conductive film 12B is set to the ground potential. That is, the second aspect of the second embodiment has the first characteristic, similarly to the basic configuration of the second embodiment.

The second aspect of the active gas generation apparatus 102 having such a configuration generates a dielectric barrier discharge in the discharge space 6 of the active gas generation electrode group 52B by applying an AC voltage between the electrode conductive film pair 10H and 10L and the electrode conductive film pair 20H and 20L. At the same time, the second aspect of the active gas generation apparatus 102 supplies the raw material gas 5 from a non-illustrated gas supply port into the in-housing space 33 of the metal housing 31, so that the raw material gas 5 is made flow inside along the gas flow 15 parallel to the X direction from both the ends in the X direction of the active gas generation electrode group 52B.

Then, the raw material gas 5 reaches the discharge space 6 via the raw material gas flow path formed above the raw material gas auxiliary member 72B.

At this time, by providing an orifice function by sufficiently narrowing the raw material gas flow gap above the raw material gas auxiliary member 72B, a desired pressure difference can be provided between the raw material gas flow path including the in-housing space 33 and the discharge space 6.

Therefore, in the second aspect of the second embodiment, the pressure in the discharge space 6 can be set to be relatively low even if the pressure in the in-housing space 33, which is located before the discharge space 6 and serves as the raw material gas supply space, is sufficiently increased.

And, in the second aspect of the active gas generation apparatus 102, the active gas 7 is generated by activating the raw material gas 5 in the discharge space 6, and the generated active gas 7 flows through the active gas flow path that is a path from the discharge space 6 to the gas ejection hole 23B in the dielectric space.

At this time, the space volume of the active gas flow path is greatly reduced by such an extent that the part of the active gas flow path is filled with the active gas auxiliary member 60B.

The active gas 7, which has passed through the active gas flow gap, passes through the gas ejection opening 65B, the gas ejection hole 23B, and the active gas passage space 31s, and is finally supplied to the subsequent processing space 63 along the gas flow 15.

<Others>

It is desirable that the raw material gas 5 to be used in the active gas generation apparatuses 101 and 102 of the first and second embodiments, respectively, is a gas containing at least one of hydrogen, nitrogen, oxygen, fluorine, and chlorine gas.

By using the above-described gas as the raw material gas, the active gas generation apparatuses 101 and 102 can perform: a film forming process for a nitride film, an oxide film, etc.; generation of an etching gas and a cleaning gas; and a surface modification process.

Hereinafter, this point will be described in detail. If nitrogen or oxygen is used as the raw material gas 5, an insulating film such as a nitride film or an oxide film can be formed. If fluorine or chlorine gas is used as the raw material gas 5, an activated fluorine gas or chlorine gas can be used as an etching gas or a cleaning gas. If hydrogen or nitrogen is used as the raw material gas 5, a surface modification process can be performed in which the surface of a predetermined object such as a substrate is hydrogenated or nitrided by an activated hydrogen gas or nitriding gas.

Examples of the material of the active gas auxiliary member 60 (60A, 60B) shown in the above-described embodiments can include insulators such as ceramic or conductors such as metals. When a conductor is used as the active gas auxiliary member 60, however, it is desirable to arrange the active gas auxiliary member 60 by securing a sufficient distance from the discharge space 6. It is because: a conductor is easy to discharge, and hence if the active gas auxiliary member 60 made of a conductor is present near the discharge space 6, there is a high possibility that the constituent elements of the active gas auxiliary member 60 may be ionized and ejected together with the active gas 7.

Examples of the material of the raw material gas auxiliary member 72 (72A, 72B) can include insulators such as ceramic or conductors such as metals.

When the active gas auxiliary member 60 and the raw material gas auxiliary member 72 are formed integrally with the electrode dielectric film 21 (21A, 21B), it is desirable that the dielectric to be used as the constituent material of the electrode dielectric film 21 is used as the constituent material of the active gas auxiliary member 60 and the raw material gas auxiliary member 72.

In the above-described embodiments, the active gas auxiliary member 60 (60A, 60B) and the raw material gas auxiliary member 72 (72A, 72B) are formed on the upper surface of the electrode dielectric film 21 (21A, 21B) of the ground potential electrode unit 2, but may be formed on the lower surface of the electrode dielectric film 11 (11A, 11B) of the high-voltage application electrode unit 1 instead of the above formation.

In this case, the formation height toward the lower side (−Z direction) of the active gas auxiliary member 60 is set to be lower than the distance (gap length) between the electrode dielectric films 11 and 21. Therefore, the active gas flow gap is provided between the lower surface of the active gas auxiliary member 60 and the upper surface of the electrode dielectric film 21 of the ground potential electrode unit 2.

By providing the active gas auxiliary member 60 on the lower surface of the electrode dielectric film 11, as described above, the active gas flow path can be limited to the active gas flow gap by filling part of the active gas flow path between the discharge space 6 and the gas ejection hole 23 in the dielectric space.

Similarly, the formation height toward the lower side of the raw material gas auxiliary member 72 is set to be lower than the distance (gap length) between the electrode dielectric films 11 and 21. Therefore, the raw material gas flow gap is provided between the lower surface of the active gas auxiliary member 60 and the upper surface of the electrode dielectric film 21 of the ground potential electrode unit 2.

By providing the raw material gas auxiliary member 72 on the lower surface of the electrode dielectric film 11, as described above, the raw material gas flow path can be limited to the raw material gas flow gap by filling part of the raw material gas flow path between the discharge space 6 and the gas ejection hole 23 in the dielectric space.

Although the present invention has been described in detail, the above description is shown as an example in all aspects and the present invention is not limited thereto. It is to be understood that countless variations that are not shown as examples can be assumed without departing from the scope of the present invention.

The invention claimed is:

1. An active gas generation apparatus that generates an active gas obtained by activating a raw material gas supplied to a discharge space, the active gas generation apparatus comprising:

a first electrode component; and a second electrode component provided below said first electrode component, wherein said first electrode component has a first electrode dielectric film and a first metal electrode formed on an upper surface of said first electrode dielectric film, said second electrode component having a second electrode dielectric film and a second metal electrode formed on a lower surface of said second electrode dielectric film, an AC voltage being applied between said first and second metal electrodes, and a dielectric space in which said first and second electrode dielectric films face each other including, as said discharge space, an area where said first and second metal electrodes overlap each other in plan view, said second electrode dielectric film has a gas ejection hole for ejecting said active gas outside, and a path from said discharge space to said gas ejection hole is defined as an active gas flow path, said first electrode component further has an auxiliary conductive film formed, independently of said first metal electrode, on the upper surface of said first electrode dielectric film, said auxiliary conductive film is provided to overlap part of said active gas flow path in plan view, and said auxiliary conductive film is set to a ground potential, and said active gas generation apparatus further comprises an active gas auxiliary member provided to fill part of said active gas flow path between said discharge space and said gas ejection hole in said dielectric space.

2. The active gas generation apparatus according to claim 1, wherein in said dielectric space, a path through which said raw material gas reaches said discharge space is defined as a raw material gas flow path, and said active gas generation apparatus further comprises a raw material gas auxiliary member provided to fill part of said raw material gas flow path in said dielectric space.

3. The active gas generation apparatus according to claim 1, wherein said raw material gas is a gas containing at least one of hydrogen, nitrogen, oxygen, fluorine, and chlorine gas.

* * * * *